United States Patent [19]

Zappe

[11] 4,097,765
[45] Jun. 27, 1978

[54] ELECTRONICALLY ALTERABLE NON-LATCHING JOSEPHSON AND, OR, NAND, NOR LOGIC CIRCUIT

[75] Inventor: Hans Helmut Zappe, Granite Springs, N.Y.

[73] Assignee: International Business Machines Corporation, Armonk, N.Y.

[21] Appl. No.: 701,374

[22] Filed: Jun. 30, 1976

[51] Int. Cl.² .......................................... H03K 19/195
[52] U.S. Cl. .................................. 307/212; 307/215; 307/218; 307/306
[58] Field of Search .............. 307/207, 208, 212, 215, 307/218, 276, 277, 306

[56] References Cited

U.S. PATENT DOCUMENTS

| 3,184,603 | 5/1965 | Hellerman | 307/212 |
| 3,571,615 | 3/1971 | Kelly | 307/207 |
| 3,818,202 | 6/1974 | Ellison | 307/207 |

*Primary Examiner*—John Zazworsky
*Attorney, Agent, or Firm*—Thomas J. Kilgannon, Jr.

[57] ABSTRACT

An electronically alterable logic circuit is disclosed which provides different logical outputs which are a function of control signals applied to the circuit. More specifically, a non-latching Josephson junction circuit is provided which is capable of providing true and complementary outputs at a pair of output terminals when at least one pair of a plurality of pairs of fixed biases are applied to a plurality of serially arranged Josephson junction devices. The Josephson devices are arranged so that a true output can be obtained from an output circuit which shunts a pair of Josephson devices while the complement of the true output can be obtained at an output circuit which shunts an appropriately biased Josephson junction which is disposed in series with the above mentioned pair of Josephson junctions. The complementary output is achieved by utilizing a portion of the output circuit which shunts the pair of Josephson junctions as a control line for the single Josephson junction in series with the pair of Josephson junctions. The current through the control line portion, when present, opposes a bias current setting up a situation such that when current flows in the output representative of a true output, no current flows in the output representative of a complementary signal and vice versa. In addition to achieving true and complementary outputs which can be characterized as AND, NAND, OR and NOR outputs, it has been recognized that these same outputs can be attained at the complementary output by simply applying binary combinations of biases to the two bias lines associated with the logic circuit.

8 Claims, 3 Drawing Figures

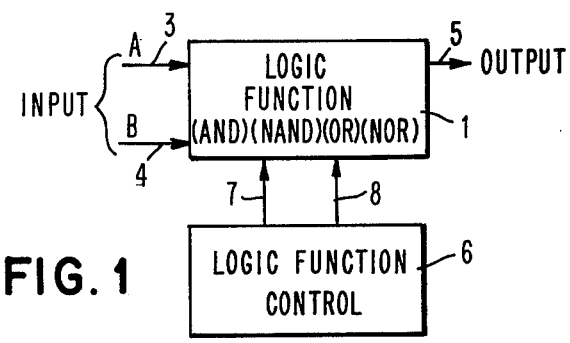
FIG. 1
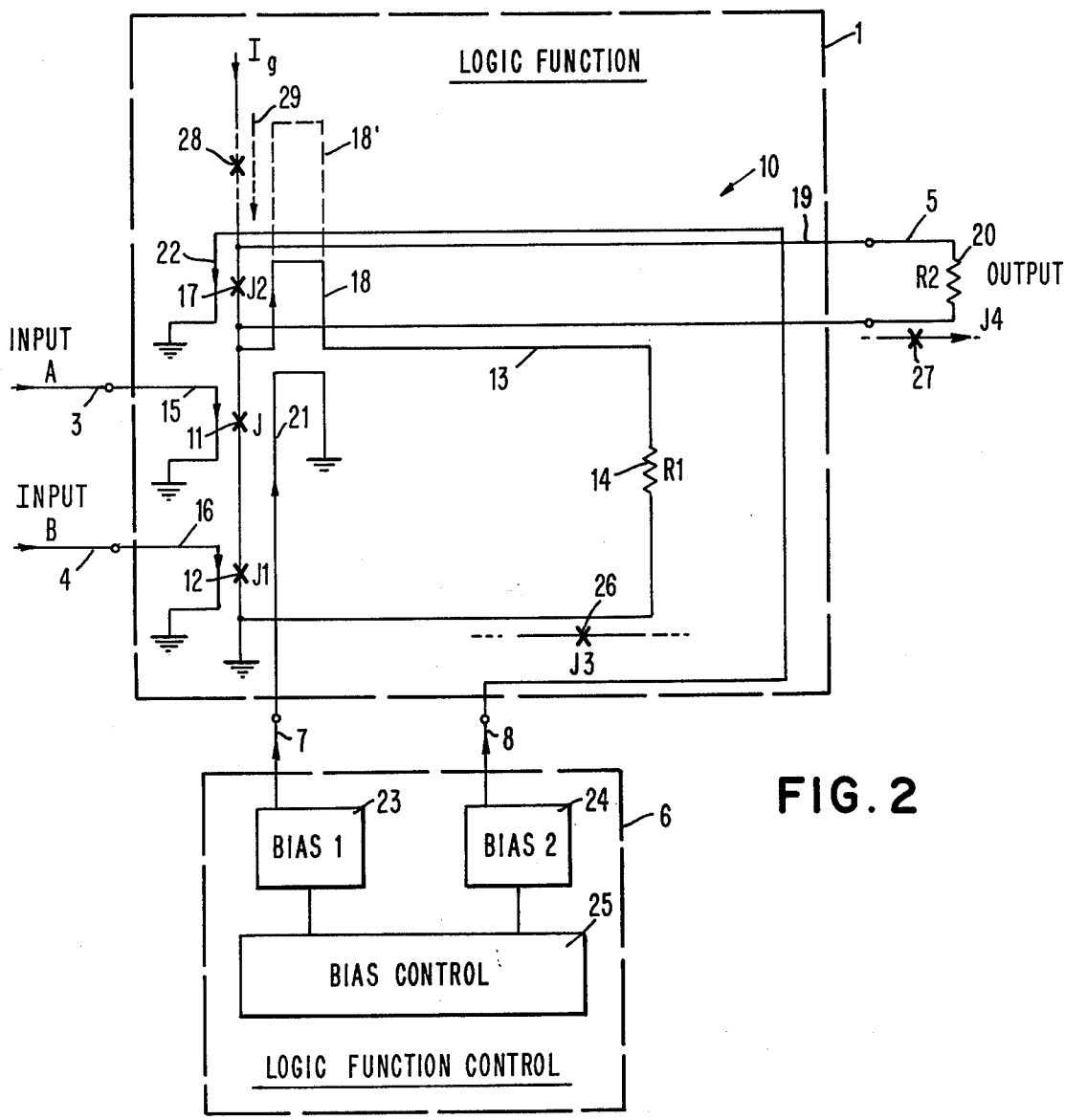
FIG. 2
FIG. 3
| INPUT A | INPUT B | OR | AND | NOR | NAND |
|---|---|---|---|---|---|
| 0 | 0 | 0 | 0 | 1 | 1 |
| 1 | 0 | 1 | 0 | 0 | 1 |
| 0 | 1 | 1 | 0 | 0 | 1 |
| 1 | 1 | 1 | 1 | 0 | 0 |
| BIAS 1 | BIAS 2 | 0 0 | 1 1 | 0 1 | 1 0 |

ELECTRONICALLY ALTERABLE NON-LATCHING JOSEPHSON AND, OR, NAND, NOR LOGIC CIRCUIT

BACKGROUND OF THE INVENTION

1. Field of the Invention

This invention relates generally to logic circuits which are capable of acting on at least a pair of input signals to provide outputs representative of the signals having been AND'ed, NAND'ed, OR'd or NOR'd. It further relates to circuits which provide the logical outputs just specified which are electronically alterable. More specifically, it relates to a circuit which utilizes Josephson junctions and to circuits incorporating such devices wherein currents in the form of control signals and biases determine whether or not individual Josephson devices or combinations of devices switch between a zero voltage state and a voltage state. In a preferred arrangement, biases applied to a Josephson junction circuit determine what logical function shall be applied to at least a pair of input signals.

In another embodiment, for fixed biases which determine what logical function is to be applied to at least a pair of input signals, true and complementary outputs are available at another output in addition to the single output previously discussed. In addition, it should be appreciated that regulation of the current supply in the series string of devices is achieved where the true and complementary outputs are utilized. In the instance of the electronically variable logic function arrangement, regulation of the current can also be achieved by the introduction of a serially disposed Josephson junction which is biased to be in the voltage state when the remaining devices are in the zero voltage state and vice versa. This device is also controlled by the same portion of the control line which controls the device across which one of the true and complementary outputs are taken such that, when one or the other or both of the pair of series Josephson junctions are switched, current flow through the control line portion overcomes the bias of the new serially disposed Josephson junction, providing a device which is in the zero voltage state. Thus, whenever certain of the Josephson junctions are in the voltage state, at least one other of the serially disposed Josephson junctions is in the zero voltage state, thereby providing a substantially constant voltage drop across the plurality of serially disposed junction devices.

2. Description of the Prior Art

Josephson junction devices are well known in the prior art where they are utilized both as memory devices in storage arrays and as switching devices in ultra-high speed logic circuits. The characteristics of a typical Josephson device are described in detail in a publication entitled "The Tunneling Cryotron — A Superconductive Logic Element Based on Electron Tunneling" by J. Matisoo which appeared in the *Proceedings of the IEEE*, February 1967, Vol. 55, No. 2, pp. 172–180. A typical logic device of the character described in the article consists of a gate and a control line which is positioned above but insulated from the gate. The control line is generally made of a superconductor such as niobium, tin or lead. The Josephson junction device itself consists of two strips of superconducting material which overlap. In the region of the overlap, the two strips of superconductive metal are separated from each other by a tunnel barrier which may be formed of an oxide of one of the superconductor strips. The oxide barrier usually has a thickness of the order of 10–30 Angstroms. The gate and control line are normally placed on a superconducting ground plane and insulated from it.

Gate current, $I_g$, is fed through the junction which, when it is in the zero voltage state, shorts an output impedance, $Z_o$. If the linear sum of the input current, $I_c$, reduces the Josephson threshold current, $I_m$, below $I_g$, the junction switches to a voltage equal to or less than $2\Delta/e$ ($2\Delta/e = 2.5$ mV for lead junctions). After switching, the voltage $V_g$ produces a current, $I_r$, equal to $V_g/Z_o$ in the output impedance. The resulting current may be utilized to control other circuits. In most instances, the switched junction remains latched in the voltage state and must be reset to the zero voltage state by a momentary decrease in $I_g$. However, d.c. powered non-latching circuits have been proposed by W. Baechtold, "Digest of Technical Papers", I.S.S.C.C., Philadelphia, 146 (1975).

Logic circuits of both the latching and non-latching type are known in the prior art. In particular, U.S. Pat. No. 3,891,864, Ser. No. 412,084, filed Nov. 2, 1973, shows logic circuits including AND, OR and NOT circuits. The patent describes the conditions for the operation of such circuits which include both resettable and reversible Josephson devices.

U.S. Pat. No. 3,843,895, Ser. No. 374,821, filed June 29, 1973 and assigned to the same assignee as the present application, shows latching AND and OR circuits. In both of these patents, the AND circuit has a plurality of Josephson junctions disposed in parallel, each of which are separately actuated by a control line, and all of these devices are shunted by a load. In the latter patent, the OR configuration is represented by a pair of serially disposed Josephson junctions, each of which is separately actuated by a control current and both are shunted by a load circuit.

Similar configurations to those just discussed are shown in IBM Technical Disclosure Bulletin, Vol. 18, No. 9, February 1976 in an article entitled "Logic Gate Personalization" by D. J. Herrell on p. 3128. In still another IBM Technical Disclosure Bulletin article entitled "Wide Margin, Non-latching Josephson Logic Family" in the name of Landman et al, Vol. 18, No. 11, April 1976, p. 3894, an AND gate is shown wherein the devices utilized operate in a non-latching mode. This article also suggests the use of biases to maintain the non-latching devices in a switched state so that, upon application of control signals to each device, the output current is removed from a load which is disposed in parallel with the devices. Such a circuit, of course, can be characterized as a NOR circuit.

IBM Technical Disclosure Bulletin, Vol. 18, No. 11, April 1976, in an article entitled "Josephson Logic Circuits with Non-linear Addition of Inputs" by D. J. Herrell et al, on p. 3897, shows both AND and OR circuit configurations which are adapted to be operated in a non-latching mode.

As can be seen from the foregoing, the use of various types of logic circuits is well known in the prior art. However, it should be noted that, at best, a single circuit configuration is only capable of producing two logic functions, such as AND and NOR as indicated hereinabove. It thus appears that there is no simple Josephson logic circuit which is capable of providing more than two logic functions and, it is not shown or suggested anywhere that more than two logic functions can be achieved with outputs representative of such functions being available at a single output.

SUMMARY OF THE INVENTION

In accordance with the broadest aspect of the present invention, an electronically controllable logic circuit is provided which includes circuit means for providing an output representative of a given logic function in response to binary input signals and further includes means connected to the circuit for changing the output to one of a plurality of outputs representative of one of a plurality of logic functions which are different from the given logic function.

In accordance with the broader aspects of the present invention, the means for changing the output includes means for applying at least a pair of biases to the circuit to obtain the output representative of the given logic function and further includes means connected to said means for applying said at least a pair of biases for applying pairs of biases different from said at least a pair of biases.

In accordance with more specific aspects of the present invention, the electronically controllable logic circuit includes means electrically connected to the circuit means for maintaining a substantially constant voltage drop across the circuit and said means for maintaining.

In accordance with still more specific aspects of the present invention, the circuit means includes a non-latching device capable of carrying Josephson current which has a zero voltage state and a finite voltage state and is shunted by a terminated transmission line. It further includes a plurality of serially disposed non-latching devices capable of carrying Josephson current which also have a zero voltage state and finite voltage states and are shunted by another terminated transmission line. The serially disposed plurality of non-latching devices are disposed in series with the first non-latching device. Also, a portion of the other terminated transmission line is disposed in electrically coupled relationship with the first non-latching device. In addition, means are connected to the plurality of devices for applying binary information signals thereto and, finally, means electromagnetically coupled to the non-latching device and the plurality of non-latching devices for biasing the devices in an initial condition, in one of said zero and said finite voltage states, are provided to provide an output representative of one of the logic functions OR, AND, NOR and NAND.

In accordance with still other aspects of the present invention, the means for changing the output includes means connected to said means for biasing for varying the zero and finite voltage states of said devices from the initial condition to provide a plurality of outputs representative of logical functions different from said given logical function.

In accordance with still other aspects of the present invention, the means for applying binary information signals is a control conductor electromagnetically coupled to each of the plurality of non-latching devices.

In accordance with still more specific aspects of the present invention, the means for biasing the devices in an initial condition includes first and second biasing conductors connected to the plurality of non-latching devices and the non-latching device, respectively, said first and second biasing conductors having applied thereto the binary biasing levels 0-0, 1-1, 0-1, 1-0 to provide an output representative of one of the logic functions OR, AND, NOR and NAND, respectively.

In accordance with still other aspects of the present invention, the means for maintaining a substantially constant voltage drop across the circuit means and the means for maintaining includes an additional non-latching device capable of carrying Josephson current which is biased on the voltage state, and further includes a portion of said another transmission line disposed in electromagnetically coupled relationship with said additional device.

It is, therefore, an object of this invention to provide an electronically controllable logic circuit which, when binary inputs are applied thereto, provides outputs representative of the logic functions AND, NAND, OR and NOR.

Another object is to provide a Josephson logic circuit in which outputs representative of a plurality of logic functions are available at a single output.

Still another object is to provide a circuit configuration, a plurality of which can be fabricated on a substrate and which, in one time frame, can apply a plurality of desired logic functions to input signals while, in another time frame, by changing binary bias levels on the individual logic circuits, can apply entirely different logic functions to binary input signals.

Yet another object is to provide an electronically variable logic circuit which has applications in the areas of data security and data scrambling.

The foregoing and other objects, features and advantages of the invention will become apparent from the following more particular description of the preferred embodiment of the invention as illustrated in the accompanying drawings.

BRIEF DESCRIPTION OF THE DRAWINGS

FIG. 1 is a block diagram of an electronically controllable logic circuit in accordance with the teachings of the present invention which is capable of producing at an output a number of different outputs representative of a number of different logical functions when signals are applied to at least a pair of input terminals. By simply changing or controlling binary current biases on logic function control terminals, input signals can be OR'd, NOR'd, AND'ed and NAND'ed.

FIG. 2 is a schematic diagram of a circuit which is capable of providing the above mentioned logic functions by simply changing the biases applied to the actuable devices of the circuit. In the circuit of FIG. 2, the actuable devices may be Josephson tunneling devices.

FIG. 3 is a truth table showing the relationship between the input signals, the electronically variable biases and the outputs obtained at R2 when the biases applied to the circuit of FIG. 2 are changed. It should be clear from the table that an output representative of the input signals having one of a number of desired logic functions applied to them can be obtained by simply changing the biases applied to the circuit.

DESCRIPTION OF A PREFERRED EMBODIMENT

Referring now to FIG. 1, there is shown therein a block diagram of an electronically controllable logic circuit which is capable of providing at an output a number of different outputs representative of a number of different logical functions which are independent of the binary signals applied to at least a pair of input terminals. Block 1, otherwise identified in FIG. 1 by the term Logic Function, is intended to represent any sort of electrical circuitry which includes actuable devices which is capable of acting on electrical signals applied to the circuit and providing, based on the circuit configuration in block 1, an output signal which indicates that the input signals have been acted on logically in a given manner. Assuming that signals A,B which are binary in character, are applied to block 1 via conductors 3,4. If block 1 contains an OR circuit, an output signal will be provided on output conductor 5 when a signal representative of a binary 1 is applied to one or the other or both of input conductors 3,4. Depending on the desired result, block 1 may contain circuits which are capable of applying AND, NAND, NOR or more complex logical functions. The arrangement described thus far represents what is being done in the prior art. Thus, the logic function in block 1 is usually configured to carry out a given logical function on signals applied to its input and, while the input may change as a result of the binary character of such inputs, the logic function applied to such signals remains fixed.

To some extent, the prior art has recognized that by maintaining a circuit in a condition which provided an output representative of an AND function by means of a bias as an initial condition, the application of an input or inputs to buck out the bias provided can produce an output which is representative of a NOR logic function being applied to the input signals. To the extent that a single bias applied to a circuit which initially produces a given logic function produces an output representative of a different logic function, the prior art has produced circuits which are capable of providing another logic function in addition to the initial logic function. Using such a straightforward implementation, it becomes clear that, to achieve more than two logic functions, at least one other circuit of a different configuration would be required in block 1, having its own input and output connections as well as its own logic function bias control. In other words, there is no known circuit arrangement which is capable of providing, at a single output, signals representative of the logic functions AND, NAND, OR and NOR by simply applying at least a pair of biases to Logic Function block 1 in FIG. 1 from Logic Function Bias Control block 6 via a pair of bias conductors 7,8. Based on the foregoing discussion, it should be clear that FIG. 1 is intended to represent, in a general way, a circuit configuration which, in response to the application of appropriate biases, is able, in addition to a given logical function, to provide a plurality of different logical functions.

Referring now to FIG. 2, there is shown therein a schematic of a circuit arrangement which, in response to the application of binary biases to the circuit, provides signals at an output which are representative of the logical functions AND, NAND, OR and NOR. In other words, different logical transfer functions are applied to binary input signals and outputs representative of the action of the transfer function on these input signals are provided at a single output. In FIG. 2, the same reference characters as utilized in FIG. 1 have been utilized in FIG. 2 for the same elements. Thus, dashed box 1 in FIG. 2 encloses a circuit configuration 10 which has binary inputs A,B applied to it via conductors 3,4 and an output is provided from circuit configuration 10 via conductors 5. In addition, dashed box 6 provides Logic Function Bias Control to circuit configuration 10 via conductors 7,8. Circuit configuration 10 is made up of a number of current controlled actuable devices and may be, for example, well known Josephson junction devices. In what follows, circuit configuration 10 will be described in terms of the actuable devices thereof being Josephson junctions, and the associated circuitry therefor will be of such a character that it is capable of operating in a cryogenic environment. Circuit configuration 10 includes a pair of Josephson junction 11,12, otherwise identified in FIG. 2 as J,J1, connected in series and shunted by a terminated transmission line 13. Transmission line 13 is terminated by a resistance 14 which is equal to the characteristic impedance, $2Z_o$, of transmission line 13 and is otherwise identified in FIG. 2 as R1.

Josephson devices 11,12 are controlled by control lines 15,16, respectively, and the latter are in turn connected to conductors 3,4, respectively.

FIG. 2 includes a Josephson junction 17, otherwise identified therein as J2, disposed in series with Josephson devices 11,12. All these devices are fed from a current source (not shown) which provides a current identified in FIG. 2 by the reference, $I_g$. A portion 18 of terminated transmission line 13 is disposed in electromagnetically coupled relationship with Josephson junction device 17. Portion 18 is utilized as a control line for junction 17. Josephson junction device 17, like devices 11 and 12, is shunted by a terminated transmission line 19. Transmission line 19 is terminated by a resistance 20 which is equal to the characteristic impedance, $2Z_o$, of transmission line 19 and is otherwise identified in FIG. 2 as R2. A pair of bias conductors 21,22 disposed in electromagnetically coupled relationship with Josephson devices J,J1 and J2, respectively, are fed from bias current sources 23,24, respectively, via conductors 7,8 respectively. Bias current sources 23,24 are otherwise identified in FIG. 2 as Bias 1, Bias 2, respectively, and each is capable of supplying current which is binary in character to its associated bias conductor. Thus, bias current sources 23,24 are capable of supplying biases representative of a binary "1" and a binary "0". As will be seen hereinbelow, the character of the output supplied by circuit configuration 10 is determined strictly by the nature of the binary biases applied from current sources 23,24 ultimately applied to control conductors 15,16. Current sources 23,24 may be any sort of pulsed source capable of putting out two current levels which, for example, may be the presence of some current value and the absence of any current value. Sources 23,24 are shown in FIG. 2 connected to block 25 otherwise identified therein as bias control. While not specifically shown, bias control 25 may be a programmable trigger circuit well known to those skilled in the electronics art which is capable of adjusting bias sources 23,24 so that at any given time current levels representative of 1 and 0 may be applied to bias conductors 21,22 via conductors 7,8, respectively. While one could normally expect biases to be applied to circuit configuration 10 for a relatively long period of time in most applications, it should be appreciated that the bias current levels from sources 23,24 may be varied at extremely high speeds in data security and scrambling applications.

Terminated transmission lines 13 and 19 have associated with them a pair of Josephson junctions 26,27, otherwise identified in FIG. 2 as J3,J4, respectively. Transmission lines 13,19 act as control conductors for devices 26,27, respectively. Josephson devices 26,27 are responsive to the presence or absence of current in their associated terminated transmission lines 13,19, respectively. The switching of either of devices 26,27 represents the sensing of information in a well-known manner.

Devices J–J4 may be any well-known type of Josephson junction or each may be a multiple junction device known as an interferometer. In addition, all the interconnection circuitry like transmission lines 13,19, control conductors 15,16 and bias conductors 21,22 is made from materials which are superconductive at the temperature of liquid helium (approximately 4.2° K). Alternatively, the transmission lines may be made of metals which remain normal at such temperatures. Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971. Resistive terminations 14,20 which must not be superconductive at the circuit operation temperatures, may be fabricated with compatible materials which display resistance at the desired operating temperature. U.S. Pat. No. 3,913,120, Ser. No. 429,461, filed Dec. 28, 1973 and assigned to the same assignee as the present invention, shows a material and method of fabrication for circuitry and a terminating resistor which may be utilized in the practice of the present invention.

The Josephson junction devices of circuit configuration 10 have the typical zero voltage state when a current, $I_g$, which is less than a maximum value is applied thereto, and a voltage state or switched condition when the current applied exceeds the maximum current value, or when, by means of an associated control line, with the same value of $I_g$, the maximum current at which a device switches to the voltage state is reduced. Thus, the devices of circuit configuration 10 do not depart in any way from the usual operation of such devices. In addition, as is well known, because of the values of resistance of R1 and R2, the devices are self-resetting, i.e., after being switched they return to the zero voltage state without reducing the gate supply current to zero.

The operation of the electronically alterable, non-latching logic circuits of the present application can be understood from the following description taken in conjunction with both FIGS. 2 and 3. The latter figure is a truth table showing the relationship between the input signals; the electronically variable biases; and the outputs obtained when the biases applied to the circuit of FIG. 2 are changed. The operation of circuit configuration 10 can be best understood by considering configuration 10 with zero current levels on bias lines 21,22 and signals representative of a binary "0" on control conductors 15,16. Under such conditions and assuming that current, $I_g$, is flowing in devices J, J1, J2, these devices are all in the zero voltage state. As a consequence current, $I_g$, flows through each of the Josephson devices and no current appears in either of terminating resistors R1,R2. Keeping the biases on current sources 23,24 at the same zero current level, apply a signal representative of a binary "1" on control conductor 15 and a signal representative of a binary "0" on control conductor 16 which are otherwise identified in FIG. 2 and FIG. 3 as Input A and Input B, respectively. Under such circumstances, because the maximum current which will cause switching of Josephson device 11 has been reduced below $I_g$ by the presence of input A on control conductor 15, Josephson device 11 switches to the voltage state, presenting a high resistance path to the current $I_g$ and causing the diversion of the latter into transmission line 13 and terminating resistor 14. The diverted current which flows through transmission line 13 also flows through portion 18 thereof, causing the switching of device J2 which in turn diverts the current $I_g$ into transmission line 19 and terminating resistor R2. At this point, it should be recalled that portion 18 of transmission line 13 is utilized as a control conductor for Josephson junction device J2. Thus, an output is obtained in transmission lines 13,19 which is capable of switching their associated sense junctions J3,J4 as a result of applying a single input to device J1. By applying a signal representative of a binary "1" on control conductor 16 and a binary "0" on control conductor 15, similar operation and outputs are obtained. Similarly, when Inputs A and B are both binary "1"'s, the same operation results and similar outputs are obtained on sensing junctions J3,J4.

By noting how the circuit configuration 10 responds to the input signals applied, it can be determined what transfer function or logic function was applied to them by circuit configuration 10. Noting that an output was sensed when a binary "1" was applied to Input A or Input B or both Inputs A and B, it can be seen that a classical definition of an OR function was applied to the inputs in the absence of any bias on bias conductors 21,22.

By testing circuit configuration 10 with binary bias levels of "1" from sources 23,24 being applied to bias conductors 21,22, respectively, it can be determined that, under such conditions, circuit configuration 10 carries out the AND function when Inputs A and B having the four possibilities shown in FIG. 3 are applied to control conductors 15,16, respectively. With binary "1" current levels on bias conductors 21,22 and Inputs A and B providing signals representative of binary "0", devices J,J1 are in the voltage state while device J2 is in the zero voltage state. J2 is in the zero voltage state because of the bucking-out of the bias on bias conductor 22 by current flowing in portion 18. The latter current resulted from the diversion of current into transmission line 13 because devices J,J1 have been switched to the voltage state as a result of the binary "1" bias on bias conductor 21. As a result, sensing junction J4 remains in the zero voltage state while sensing junction J3 is switched to the voltage state as a result of the presence of current in transmission line 13. At this point, it should be noted that, as a result of no inputs to devices J,J1, no output is seen on transmission line 19 and terminating resistor R2, while an output is obtained in transmission line 13 and terminating resistor R1. Thus, the true of the input signals is present at R2 while the complement of the input signals is present at R1. Similar circuit operation to that just described is also achieved when binary inputs 1,0 and 0,1 are applied as Inputs A and B, respectively, to control conductors 15,16, respectively. However, when Inputs A and B are each a binary "1", both of these input signals are sufficient to buck out the bias applied on bias conductor 21. As a consequence, current is rediverted back to devices J,J1 and the bucking bias applied to device J2 via portion 18 is removed, causing device J2 to switch to the voltage state as a result of the presence of a binary "1" bias current level on bias conductor 22. Current $I_g$ is diverted into transmission line 19 and termination R2 as a result of the switching of device J2 to the voltage state. The presence of current in transmission line 19 causes sensing junction J4 to switch. At the same time, sensing junction J3 has returned to the zero voltage state as a result of the absence of current in transmission line 13. Again, it should be noted that an output has been obtained across R2 which is the true of the Input signals A,B while the complement of the same input signals is obtained at output R1. From FIG. 3, it should be clear that the transfer or logic function applied to the combinations of input signals satisfies the classical definition of an AND circuit. Thus, unless both Inputs A and B are present, no output is obtained at R2 and, indeed when combinations other than both inputs are present, no output is obtained at R2. From this it can be seen that by simply applying different biases to a given circuit configuration, the transfer or logic function of that circuit configuration can be changed.

Testing further the circuit configuration of FIG. 2, the binary bias current levels "0" and "1" are applied from current sources 23,24, respectively, to bias conductors 21,22, respectively. Under such conditions, with binary "0's" on both Inputs A and B, devices J,J1 remain in the zero voltage state and no current is diverted to resistive termination R1. However, because of the binary current level "1" on bias conductor 22, device J2 switches and diverts current, $I_g$, to resistive termination R2. Device J2 switches because, while there is current in bias conductor 22, there is no current in portion 18 of transmission line 13. Thus, device J4 switches while device J3 does not switch. Thus, the absence of Input signals A,B produces an output at R2, suggesting the possibility of a NOR or NAND function having operated on the input signals. In any event, once again it should be appreciated that the true output appears at R2 while the complement of it appears at R1.

Continuing to test under the same bias conditions, with binary inputs 1-0, 0-1 and 1-1, "0" outputs are obtained at resistive termination R2 while "1" outputs are obtained at resistive termination R1. Using binary "1" inputs for both Inputs A and B, it can be seen that both devices J and J1 are switched, diverting current into portion 18 which in combination with Bias 2 provides no net control field on device J2. As a result, device J2 goes to the zero voltage state and current is rediverted through it from transmission line 19. The same action takes place with the remaining two inputs. Once again, the classical definition for a NOR circuit is fulfilled by observing the outputs obtained in FIG. 3 at terminating resistor R2. When one or the other or both inputs are a binary "1", no output is present at termination R2. It thus appears that again, by changing the bias inputs, an entirely different logic function can be applied to the input signals.

Applying now the last possible combination of biases, 1,0, on bias conductors 21,22, respectively, it can be shown that a NAND function is achieved at output R2 with these biases. With a binary "1" bias condition on bias conductor 21 and Inputs A and B being both representative of a binary "0", devices J,J1 are biased into the voltage state and current is diverted into transmission line 13 and portion 18 thereof. Because the bias on bias conductor 22 is at a binary "0" level, the presence of current in portion 18 switches device J2 to the voltage state, thereby diverting current to output terminating resistor R2 which in turn switches sense junction J4 to the voltage state. Because the presence of only one binary input at Inputs A and B is insufficient to overcome the bias supplied by bias conductor 21, devices J,J1 remain in the voltage state and outputs appear at terminating resistor R2 for binary inputs 1,0 and 0,1 in the same manner as previously described. However, where the binary inputs at Inputs A and B are both binary "1's", the bias on bias conductor 21 is overcome and devices J,J1 are reset to the zero voltage state. As a result of this, no current appears in portion 18 of transmission line 13 and J2 in the absence of the bias on bias conductor 22, also resets to the zero voltage state. As a consequence, with both Inputs A and B having signals representative of a binary "1" thereon, no output appears at termination R2. Once again, the classical definition of a NAND logical function is fulfilled in that, unless both binary inputs are present, an output will appear, if one or the other or none of the inputs is present, an output appears.

When the NAND transfer or logic function is applied to the inputs, it should be noted that the same outputs appear at terminations R1 and R2 and thus, the true and complement of the input signals are not available with this configuration. While it has not been mentioned previously, it should be appreciated that, when the OR logic function is applied to the various input signals, the same outputs appear on both R1 and R2 and the true and complement of the input signals are not available. All four logic function outputs are available, however, since it has been shown hereinabove that when the AND and NOR functions are applied to the input signals, the true output appears at R2 and the complement of that signal appears at R1. Where the true and complement outputs are available, it turns out that either J2 or both J and J1 are in the voltage state and as a result a substantially constant voltage drop occurs across the serially arranged Josephson devices. Because the devices in question are self-resetting by virtue of the value of the terminating resistors R1,R2, so that each of the devices switches to a voltage below the gap voltage, the positioning of two devices in series does not provide, as might be expected, twice the voltage drop of one device but, in fact, provides a voltage drop, when a pair or more of devices switch, which is only slightly in excess of the voltage drop across a single device. In view of this, the switching of one device to the voltage state while others remain in the zero voltage state and vice versa allows one to obtain a substantially constant voltage drop across the group of devices and regulation of the current is achieved. Regulation is achieved in the circuit when the AND and NOR functions are carried out. For the OR and NAND functions, an additional Josephson junction 28 shown in dashed lines with an associated bias line 29 can be inserted in series with the junctions J, J1 and J2 as shown in FIG. 2. Portion 18 of transmission line 13 can be extended as shown by dashed line portion 18' to control device 28 in the same manner as device J2. In this manner, then, the additional device 28 can be controlled to be in the opposite condition from devices J, J1 and J2 by the application of appropriately timed biases on bias line 29 and portion 18'.

What has been shown hereinabove is a circuit having inputs and an output, the transfer or logic function of which can be changed at will to provide at the output signals representative of the logic functions AND, NAND, OR and NOR. While it has not been specifically addressed heretofore, it should be appreciated that the input signals need not be limited to two. The addition of more inputs does not alter the transfer function applied to such signals since the resulting function is independent of the number of inputs.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A logic circuit comprising
a first non-latching device capable of carrying Josephson current having a zero voltage state and a finite voltage state shunted by a terminated transmission line,
a plurality of serially disposed non-latching devices capable of carrying Josephson current having a zero voltage state and a finite voltage state shunted by another terminated transmission line disposed in series with said first non-latching device, a portion of said another terminated transmission line being disposed in electrically coupled relationship with said first non-latching device,
means connected to said plurality of devices for applying binary information signals thereto, and
means for biasing said first non-latching device in an initial condition in one of said zero and said finite voltage states and said plurality of non-latching devices in an initial condition in one of said zero and finite voltage states to generate at said terminated transmission line one of the logic functions AND, NAND, OR, NOR.

2. A logic circuit according to claim 1 further including means electrically connected to said circuit means for providing a substantially constant voltage drop when said first non-latching device and said plurality of non-latching devices are in said zero voltage state.

3. A logic circuit according to claim 2 wherein said means for providing includes an additional non-latching device capable of carrying Josephson current biased in the voltage state and a portion of said another terminated transmission line disposed in electromagnetically coupled relationship with said additional device.

4. A logic circuit according to claim 1 wherein said means for applying includes a control line conductor disposed in electromagnetically coupled relationship with each of said plurality of non-latching devices.

5. A logic circuit according to claim 1 wherein said means for biasing includes first and second conductors electromagnetically coupled to said plurality of first non-latching devices and to said non-latching device, respectively, and first and second actuable current sources connected to said first and second conductors, respectively, adapted to provide binary biasing current to said conductors.

6. A logic circuit according to claim 5 wherein the binary biasing currents 0,1 are applied to said first and second conductors, respectively, to provide an OR output on said another terminated transmission line and a NOR output on said terminated transmission line.

7. A logic circuit according to claim 5 wherein the binary biasing currents 1,1 are applied to said first and second conductors, respectively, to provide a NAND output on said another terminated transmission line and an AND output on said terminated transmission line.

8. A logic circuit according to claim 1 further including control means connected to said means for biasing for changing said initial conditions of said first device and said plurality of devices to provide a logic function different from said one of the logic functions AND, NAND, OR, NOR, at said terminated transmission line.

* * * * *